United States Patent [19]

Fuji

[11] Patent Number: 4,519,051

[45] Date of Patent: May 21, 1985

[54] MNOS TYPE NON-VOLATILE MEMORY DEVICE AND METHOD OF MANUFACTURING THE SAME

[75] Inventor: Tatsuo Fuji, Tokyo, Japan

[73] Assignee: Nippon Electric Co., Ltd., Tokyo, Japan

[21] Appl. No.: 434,989

[22] Filed: Oct. 18, 1982

[30] Foreign Application Priority Data

Oct. 16, 1981 [JP] Japan .................. 56-165339

[51] Int. Cl.³ ............................................. G11C 11/40
[52] U.S. Cl. ..................................... 365/184; 365/189; 357/23.5
[58] Field of Search ............... 365/182, 184, 189, 230; 357/23

[56] References Cited

U.S. PATENT DOCUMENTS 4,467,452 8/1984 Saito et al. .................. 365/184

Primary Examiner—Terrell W. Fears
Attorney, Agent, or Firm—Sughrue, Mion, Zinn, Macpeak & Seas

[57] ABSTRACT

The ratio of gases during chemical vapor deposition of a silicon nitride layer in an MNOS Memory device is gradually varied during the deposition process to achieve a silicon nitride layer having a trap state distribution which gradually decreases from the oxide-nitride interface to the oxide-metal interface.

2 Claims, 4 Drawing Figures

FIG. 1
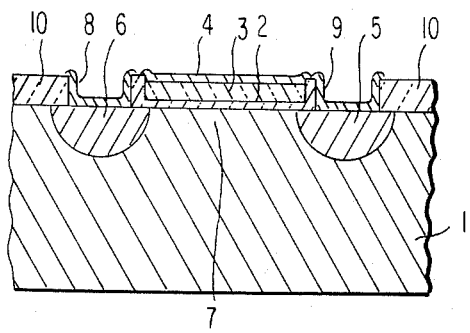
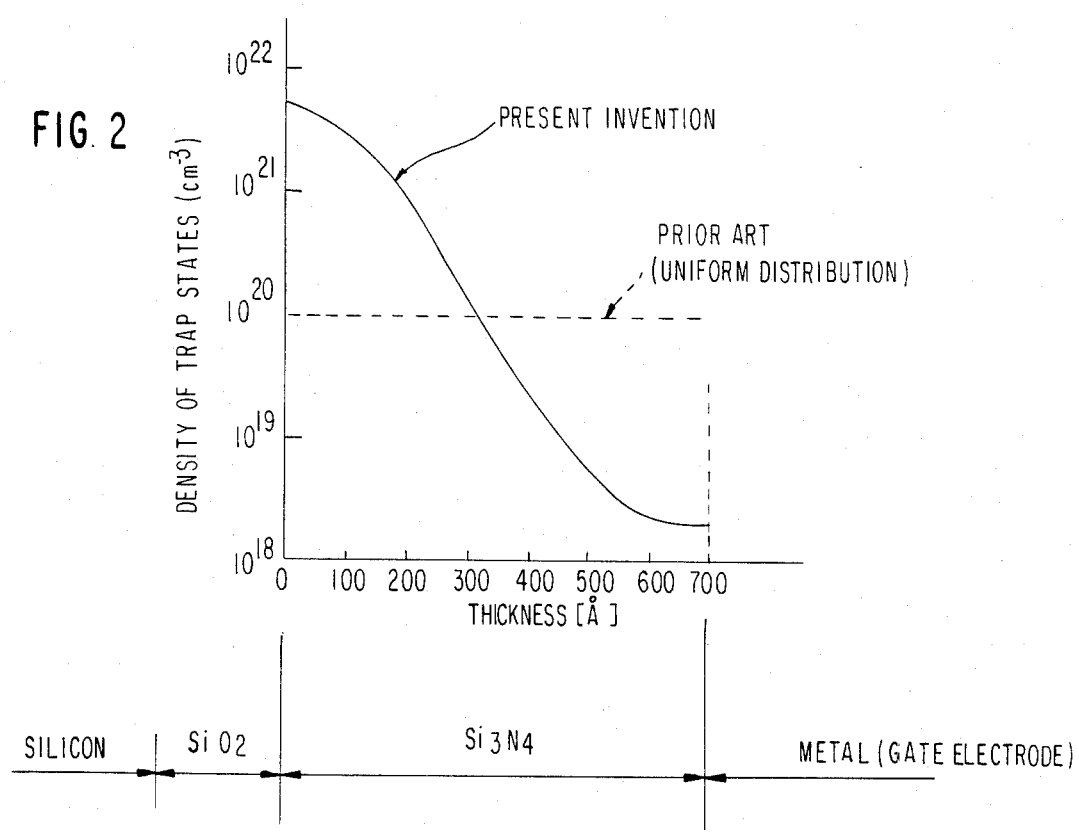

MNOS TYPE NON-VOLATILE MEMORY DEVICE AND METHOD OF MANUFACTURING THE SAME

BACKGROUND OF THE INVENTION

This invention relates to an MNOS type non-volatile memory device, i.e. a non-volatile semiconductor memory device having as its gate structure a metal layer—silicon nitride layer—silicon oxide layer—silicon structure, and a method of manufacturing the same.

An MNOS type non-volatile memory has a gate electrode on a gate insulating layer, and source and drain regions at either side of a channel region underneath the gate insulating layer, just as in a conventional MOS field effect transistor (which will be hereinafter referred to as an FET). However, an MNOS type non-volatile memory is different from an ordinary FET in that the gate insulating layer consists of an extremely thin layer of silicon oxide with a silicon nitride layer formed thereon. The silicon oxide layer permits charged carriers to pass therethrough due to the tunnel effect. The silicon nitride layer has a high density of trap states, and thereby captures and holds the cahrged carriers which have passed through the silicon oxide layer.

When a negative pulse is applied to the gate electrode while an n-type silicon substrate is grounded, for example, in a p-channel MNOS type non-volatile memory, positive holes as charged carriers pass through the extremely thin layer of silicon oxide into the silicon nitride layer due to the tunnel effect and are captured by the trap states therein. The relaxation time for the trap states in the silicon nitride layer under thermal equilibrium at the neighborhood of room temperature is very long. Accordingly, unless the thermal equilibrium is forcibly disturbed from the outside, the positive holes are held in the trap states. When the gate electrode is grounded with a negative pulse applied to the n-type silicon substrate and with positive holes held in the trap states, the positive holes captured by the trap states in the silicon nitride layer are excited and discharged. These positive holes pass through the extremely thin oxide layer due to the tunnel effect and are discharged into the n-type silicon substrate. The condition in which the positive holes are held in the silicon nitride layer, and the condition in which the positive holes are discharged from the silicon nitride layer, are externally displayed in the form of different FET threshold voltages. Therefore, when a voltage, the level of which is halfway between that of the threshold voltage at which the positive holes are held and that of the threshold voltage at which the positive holes are discharged, is applied to the gate electrode with the source grounded and with a negative voltage applied to the drain, an electric current does not flow between the source and drain when the positive holes are held, and an electric current flows therebetween when the positive holes have been discharged. Namely, the principle of an MNOS typ non-volatile memory resides in that it permits data to be electrically written therein, and data in the memory can either be electrically erased or stored therein indefinitely.

However, in a conventional MNOS type non-volatile memory, the density of the trap states in its silicon nitride layer is distributed uniformly through the thickness thereof. Accordingly, it is considered that the center of the density distribution of captured charged carriers is positioned within the silicon nitride layer rather than at the interface between the silicon oxide layer and the silicon nitride layer. In a memory having such a density distribution of charged carriers it is necessary to increase the voltage level or the width of the erasure pulse applied between the gate electrode and the substrate as compared with a memory in which the center of the density distribution of charged carriers is at the interface between the silicon oxide and silicon nitride layers. Namely, a memory having the center of the density distribution of charged carriers positioned in an inner region of the silicon nitride layer is inferior in erasing efficiency to a memory having the center of density distribution of the charged carriers positioned in the vicinity of the interface between the silicon nitride layer and the silicon oxide layer.

On the other hand, when charged carriers are held in a silicon nitride layer, an electric field induced by the carriers is generated therein unless the density distribution of the carriers is uniform. Consequently, the charged carriers flow to the gate electrode in the form of a Poole-Frenkel current due to the electric field referred to above, so that in practice the carrier-holding condition does not continue for a long period of time. The Poole-Frenkel current is generated due to the hopping conduction of charged carriers between the trap states in the silicon nitride layer. Therefore, the memory holding characteristics of an MNOS type non-volatile memory are improved in inverse proportion to the density of the trap states in the silicon nitride layer thereof. However, the lower the density of trap states in the silicon nitride layer, the deeper the center of the density distribution of the above captured charged carriers is in the silicon nitride layer. Accordingly, when the density of trap states in the silicon nitride film is decreased for increasing the holding time, the erasing efficiency is reduced.

In order to obtain excellent memory holding characteristics without causing a decrease in the erasing efficiency, a so-called $MN_1N_2OS$ FET has been proposed, which employs a double silicon nitride layer consisting of a first silicon nitride layer formed on the silicon oxide layer side and having a high density of trap states, and a second silicon nitride layer formed between the first silicon nitride layer and the gate electrode and having a low density of trap states.

However, this $MN_1N_2OS$ type of FET has a discontinuity in its dielectric constant at the interface between the first and second silicon nitride layers, so that an electric field concentration occurs at this interface. Therefore, dielectric breakdown would occur in the silicon nitride layer when a pulse voltage which is high enough to cause the carrier to be injected in or to be discharged from the silicon nitride layer, for example a pulse voltage of 30 to 35 V, is applied to the layer. Accordingly, it is necessary to make the two silicon nitride layers the same thickness. However, when the silicon nitride layers are made the same thickness, the erasing efficiency and memory holding characteristics are not improved as much as expected.

SUMMARY OF THE INVENTION

Therefore, one object of the present invention is to provide an MNOS type non-volatile memory device, which is free from the drawbacks encountered in a conventional MNOS type non-volatile memory device, and which employs a silicon nitride layer having excellent memory holding characteristics, a high erasing efficiency and a high dielectric pressure resistance.

Another object of the present invention is to provide a method for effectively manufacturing the above MNOS type non-volatile memories.

According to one feature of the present invention, there is provided an MNOS type non-volatile memory comprising a semiconductor substrate of one conductive type, source and drain regions of the opposite conductive type provided in the semiconductor substrate, a silicon oxide layer provided on a channel region between the source and drain regions, a silicon nitride layer provided on the silicon oxide layer, and a gate electrode provided on the silicon nitride layer, the density of the trap states in the silicon nitride film continuously decreasing from the interface between the silicon nitride layer and the silicon oxide layer to the interface between the gate electrode (metal) and the silicon nitride layer.

The thickness of the silicon oxide layer is preferably 10 to 30 Å, and the thickness of the silicon nitride layer is preferably 200 to 1000 Å, According to another aspect of the present invention, there is provided a method for manufacturing MNOS type non-volatile memories, comprising the step of carrying out a chemical vapor-phase growth process of a silicon nitride layer, the process including mixing a first gas of a silicon-containing vapor compound and a second gas of nitrogen-containing vapor compound and heating the mixing gasses, to generate silicon nitride, the ratio R of the amount of the first gas to that of the second gas being uniformly decreased from the start of growth of the silicon nitride layer to the end of growth thereof.

BRIEF DESCRIPTION OF THE DRAWINGS

FIG. 1 is a cross section in schematic representation of an embodiment of an MNOS type non-volatile memory device according to the present invention;

FIG. 2 is a graph showing the density distribution of trap states in the silicon nitride layer through the thickness of the layer in the embodiment of the present invention;

DESCRIPTION OF THE PREFERRED EMBODIMENT

Figure 3:
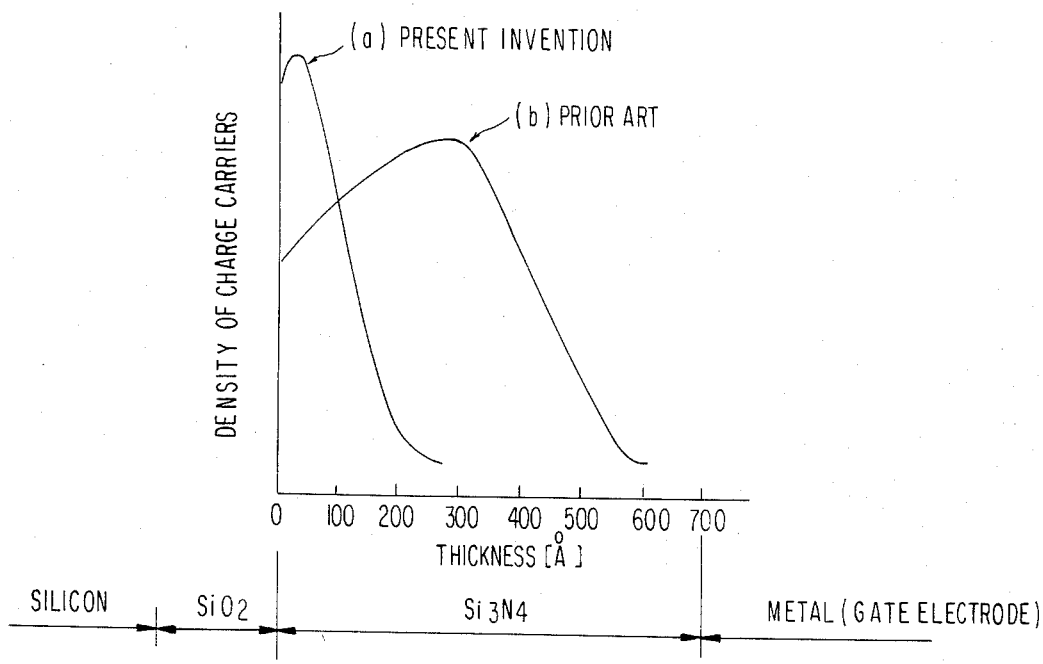
FIG. 3 is a graph showing the density distribution (a) of charged carriers in the silicon nitride layer in the embodiment of the present invention, and (b) that in a conventional MNOS type FET.

As shown in FIG. 1, a thick field oxide layer 10 is formed on the main surface of an n-type semiconductor substrate 1, and p-type source and drain regions 6, 5 are provided in the active region surrounded by or adjacent to the field oxide layer 10 with source and drain electrodes 8, 9 connected to the source and drain regions, respectively. A silicon oxide layer 2 having a thickness of 10 to 30 Å, for example 20 Å, and a silicon nitride layer 3 having a thickness of 200 to 1000 Å, for example 700 Å, are provided on a channel region 7 positioned between the source and drain regions. The silicon oxide layer 2 and the silicon nitride layer 3 constitute a gate insulating layer. A gate electrode made of a material such as aluminum, molybdenum, polysilicon or metal silicide is provided on the silicon nitride layer 3. The density distribution of trap states in the silicon nitride ($Si_3N_4$) layer in this embodiment decreases regularly, as shown by the solid line in FIG. 2, from the interface between the silicon nitride layer and the silicon oxide ($SiO_2$) layer to the interface between the silicon nitride layer and the metal (gate electrode). This distribution differs greatly from the distribution in a prior art silicon nitride layer, shown by the dotted line having a uniform density distribution of trap states in the same figure.

FIG. 3 shows the density distribution (a) of charged carriers in the silicon nitride layer in the embodiment of the present invention and the density distribution (b) in the layer in a prior art device having a uniform density distribution of trap states. The graph shows that the center of the density distribution (a) of charged carriers in the embodiment of the present invention is closer to the interface between the silicon oxide and silicon nitride layers compared with the center of the density distribution (b) in the prior art device. This indicates that the embodiment of the present invention has an improved erasing efficiency.

Figure 4:
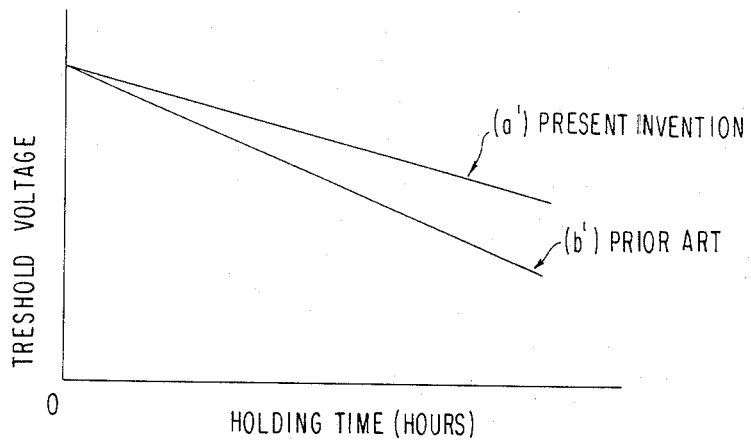
FIG. 4 is a graph showing the memory holding characteristics (a') of the embodiment of the present invention, and (b') that of a conventional MNOS FET.

FIG. 4 shows the memory holding characteristics (a') of the MNOS type non-volatile memory embodying the present invention compared with (b') that of a prior art MNOS type non-volatile memory employing a silicon nitride layer having a uniform density distribution of trap states. The graph clearly shows that the embodiment of the present invention has improved memory holding characteristics. For example, the rate of decrease (a') of the threshold voltage in the embodiment of the present invention is $-1.0$ V/decade, while the rate of decrease (b') of the threshold voltage in the prior art memory is $-1.8$ V/decade. The dimension V/decade means the decrease in threshold voltage during a period of time, in which the retention time increases by one digit representing the number of units i.e. for decimal notation in which each digit represents 10 units, the decrease in threshold voltage per ten units of time.

Since the silicon nitride layer used in the present invention does not have a inner surface with a permittivity discontinuity, an electric field concentration does not occur. Accordingly, a voltage pulse of a level required to apply or erase charged carriers does not cause dielectric breakdown in the silicon nitride layer.

As described above, when the present invention is used the erasing efficiency and memory holding characteristics of a MNOS type non-volatile memory can be improved to a great extent.

The above embodiment has been described with reference to a p-channel type device. However, an n-channel type device will, of course, obtain the same effect.

Such effective silicon nitride layers could be obtained by the following method.

Dichlorosilane ($SiH_2Cl_2$) is used as a first gas, and ammonia ($NH_3$) as a second gas. A gaseous mixture consisting of nitrogen ($N_2$), which is used as a carrier gas, and the first and second gases is introduced into a hot wall reaction tube to form a silicon nitride layer ($Si_3N_4$ layer). During the formation of this silicon nitride layer, the mixing ratio ($SiH_2Cl_2$)/($NH_3$) of the first gas to the second gas is set at $\frac{1}{3}$ at the start of the formation thereof, and is continuously decreased as the $Si_3N_4$ layer grows, in such a manner that the mixing ratio is 1/000 at the end of the formation of the layer. Thus, a $Si_3N_4$ layer having the density distribution of trap states shown in FIG. 2 can be obtained.

The above phenomenon can be explained as follows.

A $Si_3N_4$ layer grown in a gas phase at a temperature of not more than 840° C. is in a non-crystalline state. The composition of this $Si_3N_4$ layer is not in agreement with the stoichiometric composition (Si:N=3:4); and this $Si_3N_4$ layer contains silicon with dangling bond electrons. The dangling bond electrons cause the trap states. In order to decrease the amount of silicons which has dangling bond electrons, the flow rate of the $NH_3$, which is the material for the production of nitrogen, may be set higher than the ratio ($SiH_2Cl_2$: $NH_3$ = 3:4) in accordance with the chemical equilibrium equation. Moreover, $SiH_2Cl_2$ and $NH_3$ react in accordance with the formula:

$$SiH_2Cl_2 + NH_3 \rightarrow Si_3N_4 + H_2 + HCl$$

In this reaction, the $H_2$ in the $SiH_2Cl_2$ is combined with the $Cl_2$ to form HCl, while the hydrogen in the $NH_3$ turns the dangling bond electrons into combined electrons to decrease the number of trap states.

As mentioned above, when the flow rate of $NH_3$ is thus increased, the amount of silicon with dangling bond electrons is reduced, and therefore, the number of trap states become small.

When the flow ratio of $SiH_2Cl_2$ to $NH_3$ in the formation of a $Si_3N_4$ layer in a non-crystalline state is thus decreased continuously from the start of growth thereof to the end of growth thereof, the density of trap states in the $Si_3N_4$ layer can be decreased continuously from the $SiO_2$-$Si_3N_4$ interface to the surface of the $Si_3N_4$, i.e. the surface constituting the interface between the $Si_3N_4$ layer and the metal.

In order to turn the dangling bond electrons into combined electrons, it is not necessary to use hydrogen; a chemical element having a low activation energy, for example oxygen, may be used. Accordingly, nitrogen dioxide ($NO_2$) may be used as the second gas. Monosilane ($SiH_4$) or silicon tetrachloride ($SiCl_4$) may be used as the first gas. Even when a cold wall reaction tube, which is not heated to a high temperature, of an induction heating system using microwaves may be employed to heat the gaseous mixture, the effect of thepresent invention described above can be obtained in the same manner

I claim:

1. An MNOS type non-volatile memory comprising a semiconductor substrate of one conductivity type, source and drain regions of the opposite conductivity type provided in said semiconductor substrate, a thin silicon oxide layer provided on a channel region between said source and drain regions, a silicon nitride layer provided on said thin silicon oxide layer and having trap states therein, and a gate electrode provided on said silicon nitride layer, the density of trap states in said silicon nitride layer decreasing continuously in the direction from the interface between said silicon nitride layer and said silicon oxide layer to the interface between said silicon nitride layer and said gate electrode.

2. An MNOS type non-volatile memory according to claim 1, wherein the thickness of said silicon nitride layer is 200 to 1000 Å.

* * * * *